United States Patent
Lee

(10) Patent No.: US 8,000,149 B2
(45) Date of Patent: Aug. 16, 2011

(54) NON-VOLATILE MEMORY DEVICE

(75) Inventor: Hee Youl Lee, Icheon-Si (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 12/856,190

(22) Filed: Aug. 13, 2010

(65) Prior Publication Data

US 2010/0302862 A1    Dec. 2, 2010

Related U.S. Application Data

(62) Division of application No. 12/233,241, filed on Sep. 18, 2008, now Pat. No. 7,800,952.

(30) Foreign Application Priority Data

Sep. 27, 2007   (KR) .............................. 2007-0097295

(51) Int. Cl.
*G11C 11/34* (2006.01)
*G11C 16/04* (2006.01)

(52) U.S. Cl. .............................. 365/185.19; 365/185.18

(58) Field of Classification Search ............. 365/185.19, 365/185.18, 185.2, 189.07
See application file for complete search history.

(56) References Cited

U.S. PATENT DOCUMENTS

| | | | |
|---|---|---|---|
| 5,532,971 A | 7/1996 | Tanaka et al. | |
| 6,940,756 B2 | 9/2005 | Mastroianni et al. | |
| 7,466,588 B2 | 12/2008 | Mylly | |
| 2001/0040836 A1* | 11/2001 | Mori et al. | 365/240 |
| 2008/0253181 A1* | 10/2008 | Edahiro et al. | 365/185.03 |

FOREIGN PATENT DOCUMENTS

| | | |
|---|---|---|
| KR | 1020030031652 | 4/2003 |
| KR | 1020060023798 | 3/2006 |

* cited by examiner

*Primary Examiner* — Anh Phung
(74) *Attorney, Agent, or Firm* — Marshall, Gerstein & Borun LLP

(57) ABSTRACT

The present invention relates to a method of operating a non-volatile memory device. In an aspect of the present invention, the method includes performing a first program operation on the entire memory cells, measuring a first program speed of a reference memory cell, storing the first program speed in a program speed storage unit, repeatedly performing a program/erase operation until before a number of the program/erase operation corresponds to a specific reference value, when the number of the program/erase operation corresponds to the specific reference value, measuring a second program speed of the reference memory cell, calculating a difference between the first program speed and the second program speed, resetting a program start voltage according to the calculated program speed difference, and performing the program/erase operation based on the reset program start voltage.

7 Claims, 6 Drawing Sheets

700

NON-VOLATILE MEMORY DEVICE

CROSS-REFERENCE TO RELATED APPLICATIONS

This is a division of U.S. application Ser. No. 12/233,241 filed Sep. 18, 2008, now U.S. Pat. No. 7,800,952; issued on Sep. 21, 2010, which claims the priority benefit under USC 119 of KR 10-2007-0097295 filed Sep. 27, 2007, the entire respective disclosures of which are incorporated herein by reference.

BACKGROUND OF THE INVENTION

The present invention relates to a non-volatile memory device and a method of operating the same, in which a program voltage of the non-volatile memory device is controlled variably according to the number of a program/erase operation.

In recent years, there is an increasing demand for non-volatile memory devices which can be electrically programmed and erased and do not need the refresh function of rewriting data at certain intervals.

The non-volatile memory device is configured to perform the program or erase operation by injecting electrons or deleting electrons into or from the floating gate of each cell.

A NAND type non-volatile memory device of the non-volatile memory devices includes a number of cell strings in which a plurality of memory cells is connected in series. In terms of the cell string structure, when a specific cell is read, unselected cells other than a selected cell are bypassed or turned on. Thus, to the word line of the unselected cell is applied a pass voltage higher than the threshold voltage of a corresponding cell in order to turn on the corresponding cell. However, unselected cells, which are programmed using a threshold voltage higher than that of other which are programmed using a threshold voltage higher than that of other unselected cells because they have a faster program speed, may not be turned on although a corresponding pass voltage is applied. If there exist cells that are not turned on as described above, it is very difficult to precisely determine whether a selected cell has been programmed in a corresponding cell string.

This is because cells whose threshold voltage rises rapidly and cells whose threshold voltage rises relatively slowly coexist even though the same program voltage is applied to both the cells. In order to prevent this problem, the incremental step pulse program (ISPP) programming method of performing programming on cells having a fast program speed at a relatively low program voltage and on cells having a slow program speed at a relatively high program voltage.

However, the characteristics of a cell or the program speed of a cell is always not uniform. If the program and erase operations are executed repeatedly, the tunnel oxide layer of a cell is damaged and/or traps, etc., are generated. Consequently, the program speed rises on the whole.

As described above, as the program and erase operations are repeated, the program speed of a cell rises. Accordingly, there is a need to control a program voltage.

BRIEF SUMMARY OF THE INVENTION

The present invention is directed to provide a non-volatile memory device, in which a program speed is measured according to a predetermined number of a program/erase operation and a program start voltage is reset according to the measured program speed.

The present invention is also directed to provide an operating method employing the non-volatile memory device.

A non-volatile memory device according to an aspect of the present invention includes a program speed detection unit for measuring a program speed of reference memory cells of the entire memory cells, a program speed storage unit for storing the program speed, and a program voltage controller for determining whether to change a program voltage by comparing a first program speed stored in the program speed storage unit and a second program speed detected through the program speed detection unit according to a number of a program/erase operation.

A method of operating a non-volatile memory device according to another aspect of the present invention includes performing a first program operation on the entire memory cells, measuring a first program speed of a reference memory cell, storing the first program speed in a program speed storage unit, repeatedly performing a program/erase operation until before a number of the program/erase operation corresponds to a specific reference value, when the number of the program/erase operation corresponds to the specific reference value, measuring a second program speed of the reference memory cell, calculating a difference between the first program speed and the second program speed, resetting a program start voltage according to the calculated program speed difference, and performing the program/erase operation based on the reset program start voltage.

A method of operating a non-volatile memory device according to still another aspect of the present invention includes performing a first program operation on the entire memory cells, measuring a first program speed of a reference memory cell, storing the first program speed in a program speed storage unit, repeatedly performing a program/erase operation until before a number of the program/erase operation corresponds to a reference value, when the number of the program/erase operation corresponds to the reference value, measuring a second program speed of the reference memory cell, deciding a change amount of distributions of the reference memory cell, calculating a difference between the first program speed and the second program speed, resetting a program start voltage according to the calculated program speed difference and the decided change amount of distributions, and performing the program/erase operation based on the reset program start voltage.

DESCRIPTION OF SPECIFIC EMBODIMENTS

Now, specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

Figure 1:
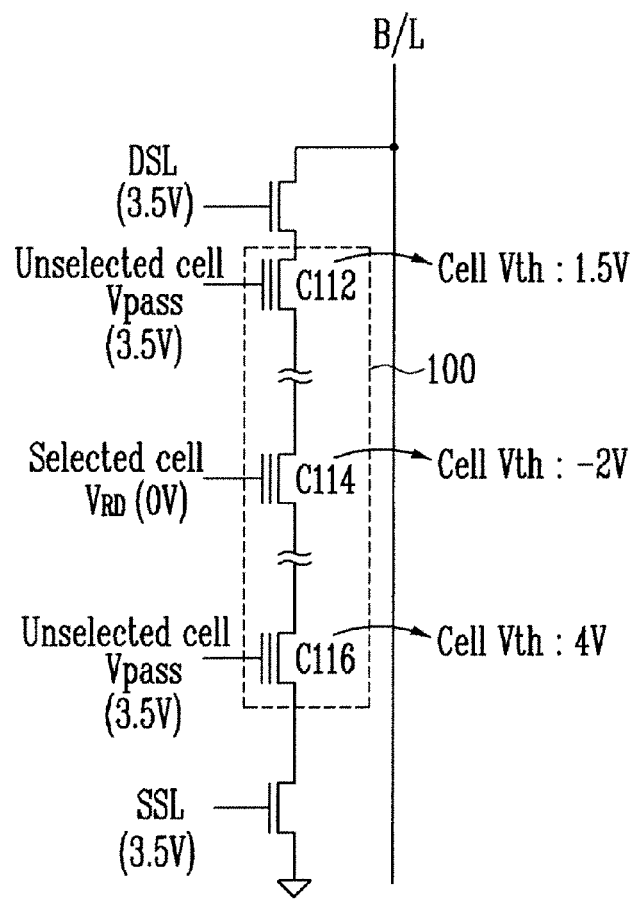
FIG. 1 is a diagram showing the cell string structure of a non-volatile memory device used in the present invention.

FIG. 1 is a diagram showing the cell string structure of a non-volatile memory device used in the present invention.

The NAND type non-volatile memory device of the present invention includes a cell string 100 in which a plurality of memory cells is connected in series.

The non-volatile memory device further includes a drain select transistor that selectively connects the cell strings and a bit line B/L, and a source select transistor that selectively connects the cell strings and a ground.

In the case of the read operation, a read reference voltage Vrd is applied to the gate of a selected cell C114 to be read and a pass voltage Vpass is applied to the remaining unselected cells C112, C116. For example, the read reference voltage of 0V can be applied to the selected cell and the pass voltage of 3.5V can be applied to the unselected cells. At the same time, the pass voltage of 3.5V is applied to the drain select transistor and the source select transistor, respectively.

In this state, it is determined whether a current path from the bit line to the ground has been formed depending on whether a corresponding cell has been programmed using a voltage of 0V or more. That is, when a corresponding cell has been programmed using a voltage of 0V or more, the corresponding cell is not turned on, so a current path is not formed. However, when a corresponding cell has not been programmed using a voltage of 0V or more, a corresponding cell is turned on to thereby form a current path.

Here, if whether a current path has been formed is controlled using the threshold voltage of an unselected cell except for a selected cell, the threshold voltage of the selected cell cannot be read precisely. That is, if the program speed of a unselected cell is faster than that of other cells and the threshold voltage of the unselected cell is higher than a pass voltage (in the case of C116), a corresponding cell is not turned even though a pass voltage is applied thereto.

Distributions of the threshold voltage are described in more detail with reference to the drawing.

Figure 2:
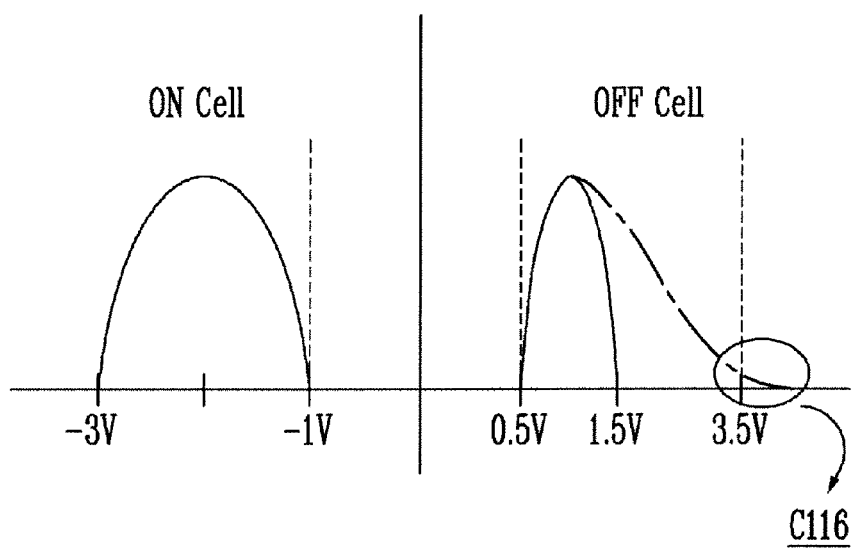
FIG. 2 is a diagram showing distributions of the threshold voltage according to the programming of a non-volatile memory device.

FIG. 2 is a diagram showing distributions of the threshold voltage according to the programming of a non-volatile memory device.

This drawing shows distributions of cells (ON cells) programmed using the threshold voltage of 0V or less and cells (OFF cells) programmed using the threshold voltage of 0V or higher.

In the case of a read operation, though a pass voltage of 3.5V higher than distributions (0.5 to 1.5V) of typical ON cells is applied to unselected cells in order to turn on all the unselected cells, if there are cells (for example, C116) having the threshold voltage higher than the pass voltage, the cells are not turned on.

As described above, as the program speeds of cells quite differ, the influence on the program read operation might be great.

This is because cells whose threshold voltage rises rapidly and cells whose threshold voltage rises relatively slowly depending on the characteristics of the cells coexist even though the same program voltage is applied to both the cells. To prevent this problem, the ISPP programming method of performing programming on cells having a fast program speed at a relatively low program voltage and cells having a slow program speed at a relatively high program voltage is used.

However, the characteristics of a cell or the program speed of a cell is always not uniform. If the program and erase operations are executed repeatedly, the tunnel oxide layer of a cell is damaged and/or traps, etc., are generated. Consequently, the program speed rises on the whole.

Figure 3:
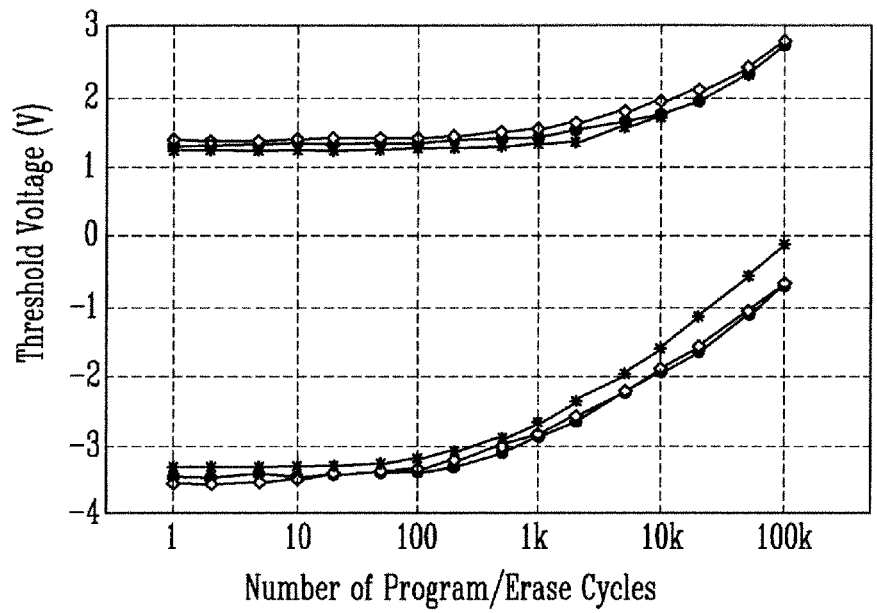
FIG. 3 is a characteristic graph showing a change of the threshold voltage depending on the number of the program and erase operations that are repeatedly executed.

FIG. 3 is a characteristic graph showing a change of the threshold voltage depending on the number of the program and erase operations that are repeatedly executed.

As the number of the program and erase operations is increased, the threshold voltage of a memory cell becomes higher than a target voltage after the program or erase operation is performed. That is, at the time of a program operation, a memory cell is programmed rapidly and therefore the threshold voltage of the cell becomes higher than a target voltage. In this state, the program operation is continuously performed. Further, at the time of an erase operation, a memory cell is erased slowly and therefore the threshold voltage of the cell becomes higher than a target voltage. In this state, the erase operation is continuously performed.

To solve this problem, a method of applying a lower start bias of ISPP can be used. That is, referring to the graph of FIG. 3, if the program or erase operation is performed so that the threshold voltage rises about 1.5V on the whole, a program start voltage, which is lower 1.5V than a typical voltage, is applied. However, this method is problematic in that a program time is extended as much as a low voltage. In other words, assuming that the step voltage of ISPP programming is 0.3V and the time taken per program cycle is 50 μs, the time of about 250 μs is added in order to increase 1.5V.

Figure 4:
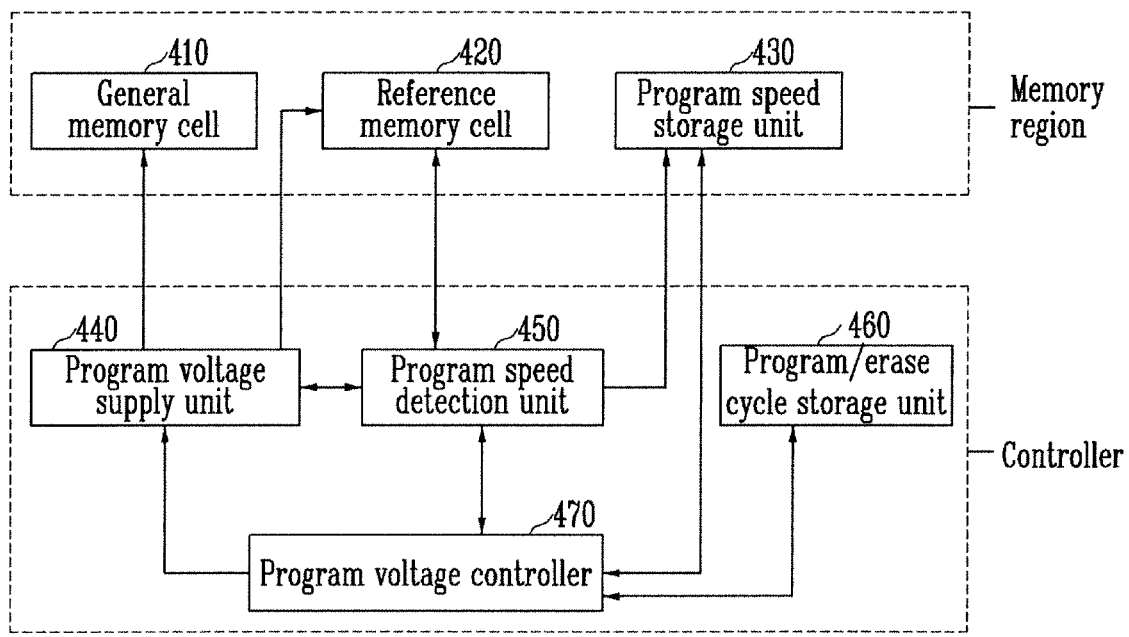
FIG. 4 is a block diagram showing a non-volatile memory device according to an embodiment of the present invention.

FIG. 4 is a block diagram showing a non-volatile memory device according to an embodiment of the present invention.

A non-volatile memory device 400 includes a general memory cell 410 in which data is stored, a reference memory cell 420, which performs the same function as that of the general memory cell 410, but becomes a sample for measuring the program speed of a cell, and a program speed storage unit 430 for storing the program speeds of the reference memory cells 420.

Here, the terminology "program speed" refers to the number of program voltages applied to a corresponding word line until the reference memory cells 420 are all programmed at a specific verify voltage or higher, or the number of program pulses applied until the reference memory cells 420 reach a corresponding program voltage. This is described in more detail later on.

Meanwhile, the non-volatile memory device 400 further includes a program voltage supply unit 440 for applying a program voltage to the general memory cell 410 and the reference memory cell 420, a program speed detection unit 450 for determining whether the reference memory cells 420 have all been programmed at a specific verify voltage or higher and detecting voltage applied to a corresponding word line at a corresponding point of time, a program/erase cycle storage unit 460 for storing a total number of program/erase operations of a non-volatile memory device, and a program voltage controller 470 for determining to lower a program voltage by comparing a first program speed stored in the program speed storage unit 430 and a second program speed detected by the program speed detection unit 450 depending on the number of the program/erase operations.

Each of the constituent elements of the non-volatile memory device 400 is described in more detail below.

The general memory cell 410 and the reference memory cell 420 correspond to the above-mentioned NAND type non-volatile memory cell and are subject to the program/read/erase operations in the same manner.

However, the reference memory cell 420 is a collection of cells, becoming a sample for measuring the program speeds of the cells. Since the speed of the entire memory cells can be predicted using only several cell groups, some of the entire memory cells is selected and the program speed of corresponding cells is measured.

Here, the reference memory cell can be one in number or include a plurality of cells per on a block, plain or page basis.

The program speed is described in short below.

The ISPP programming method is a method of performing programming by continuously increasing a program start voltage by a step voltage. Thus, it is considered that the program speed is fast if programming is completed in a state where a raised voltage is low or the number of an increased program start voltage is small.

According to an embodiment, the program speed can be determined based on a program voltage applied to a corresponding word line when programming is completed over a target verify voltage. That is, if programming is completed even at a low program voltage, it is considered that the program speed of a corresponding cell is fast.

According to another embodiment, the program speed can be determined based on the number of voltages applied until a target verify voltage reaches a program voltage applied to a corresponding word line when programming is completed over the target verify voltage. That is, if programming is completed even at a low voltage, it is considered that the program speed of a corresponding cell is fast.

In this manner, the program speed of the reference memory cells 420 is measured.

The program speed storage unit 430 functions to store the program speed.

The program speed storage unit 430 can be included in a non-volatile memory region such as a memory cell, a flag cell or a spare cell. The program speed storage unit 430 can also be included in a register, ROM, a cam cell, etc., which is included in a controller, unlike the above.

According to an embodiment, the stored program speed can become a program voltage applied to a corresponding word line when programming is completed over a target verify voltage.

According to another embodiment, the stored program speed can become the number of program pulses applied until a target verify voltage reaches a program voltage, which is applied to a corresponding word line until programming is completed over the target verify voltage.

Meanwhile, data stored in the program speed storage unit 430 is stored per on a program/erase-cycle basis. A corresponding number can be stored whenever the program/erase operation is completed once or periodically stored every n cycle according to a user.

Alternatively, the number can be stored every log(M) times, 10 times, 100 times, 1000 times, 10000 times or the like.

Here, a number in which the program/erase operations are repeated can be decided ideally based on the erase operation or may be decided selectively based on the program operation according to a user.

Further, the program voltage supply unit 440 supplies a program voltage to the general memory cell 410 and the reference memory cell 420.

A start program voltage that is continuously increased by a step voltage is applied according to the ISPP method.

The program voltage supply unit 440 variably supplies the start program voltage or the step voltage in response to the program voltage controller 470.

If the number of a program/erase operation is increased and it is therefore determined that a program speed is high, the start program is lowered and supplied. Here, a degree in which the start program is lowered can be about a unit step voltage. For instance, assuming that a step voltage is 0.3V, if it is determined that a program speed is high, the step voltage is lowered every 0.3V.

The program speed detection unit 450 determines whether the reference memory cells 420 have all been programmed over a specific verify voltage and detects voltage applied to a corresponding word line at a corresponding point of time.

Alternatively, the program speed detection unit 450 can determine whether the reference memory cells 420 have all been programmed over a specific verify voltage and detect the number of program pulses applied until voltage applied to a corresponding word line is reached at a corresponding point of time.

The program speed detection unit 450 stores the detected program speed in the program speed storage unit 430.

The program/erase cycle storage unit 460 stores a total number of program/erase operations performed during the operation of the non-volatile memory device.

The non-volatile memory device of the present invention includes memory having a non-volatile characteristic that corresponding times can be stored even though power supplied to the non-volatile memory device is stopped.

Although it is illustrated that the program/erase cycle storage unit 460 is included in the controller, the program/erase cycle storage unit 460 may be included in the memory region depending on a specific embodiment.

The program voltage controller 470 determines whether to lower the program voltage by comparing the first program speed stored in the program speed storage unit 430 and the second program speed detected by the program speed detection unit 450 depending on the number of the program/erase operations.

In the present invention, whether a program speed becomes fast is determined even specific cycle by reflecting the characteristic of a non-volatile memory cell in which a program speed becomes fast as the number of the program/erase operation increases, and whether to lower a program start voltage is determined based on the determination result.

According to an embodiment, a program speed after the program/erase operation is performed once is detected and then stored in the program speed storage unit 430 as a first program speed.

A program speed after the program/erase operation is performed n times is detected and then compared with the first program speed. If, as a result of the comparison, the program speed is faster than a reference value, the program voltage supply unit 440 is controlled to change the program start voltage.

A program/erase method employing the non-volatile memory device is described in more detail below.

Figure 5:
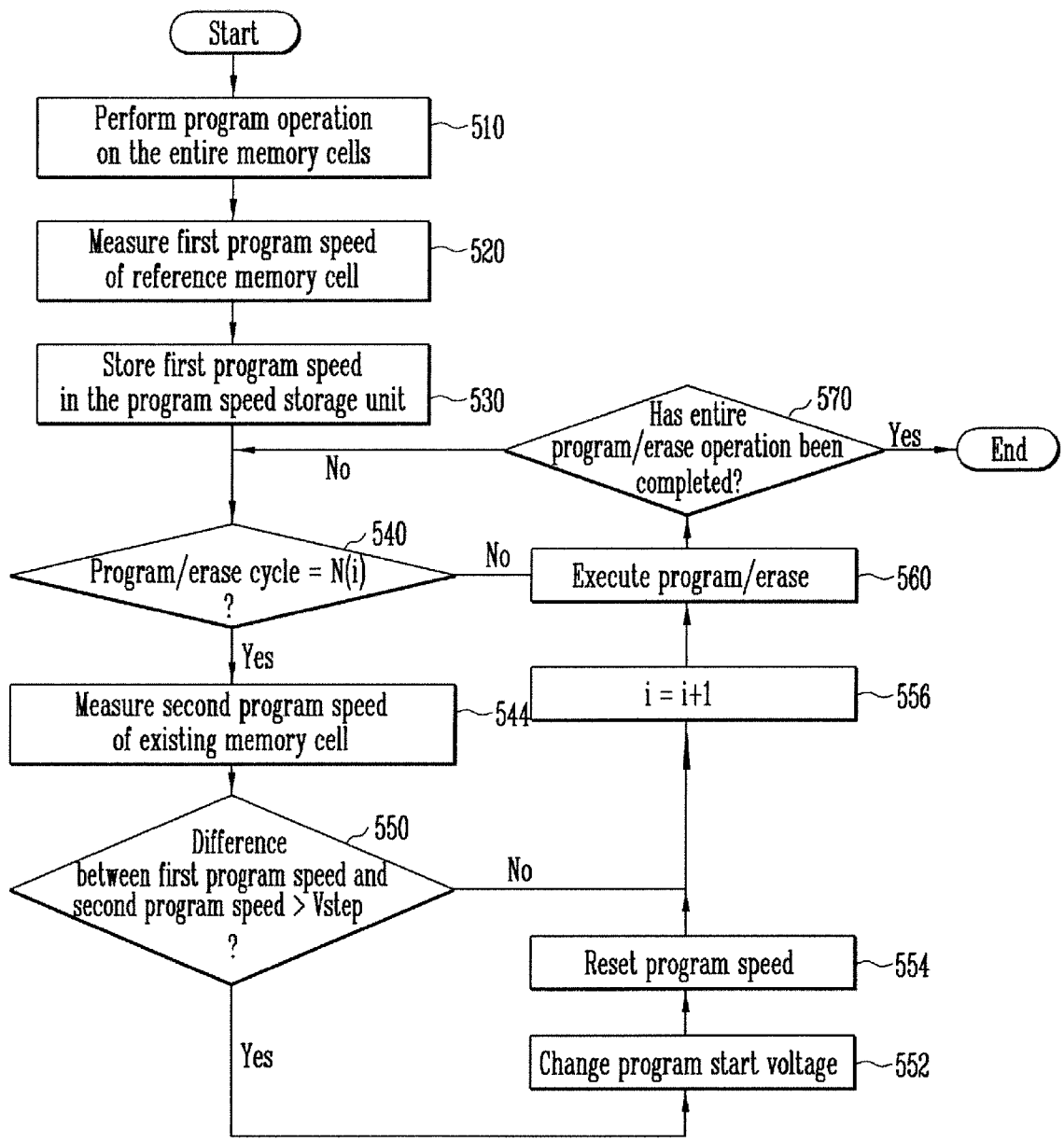
FIG. 5 is a flowchart illustrating an operation of the non-volatile memory device according to an embodiment of the present invention.

FIG. 5 is a flowchart illustrating an operation of the non-volatile memory device according to an embodiment of the present invention.

A program operation is first performed on the entire memory cells at step 510.

The program operation is performed on the general memory cell 410 and the reference memory cell 420 in the same manner.

A first program speed of the reference memory cell 420 is then measured at step 520.

In more detail, a program voltage, which is applied to the word line when the program operation on the reference memory cell is completed, is measured, or the number of program pulses applied to the word line according to the ISPP program method so that the program voltage is applied is measured.

This is performed through the program speed detection unit 420.

The first program speed is stored in the program speed storage unit 430 at step 530.

A method of storing the first program speed may differ depending on a construction of the program speed storage unit 430. The stored program speed becomes a number data of a program voltage or a program pulse.

For instance, assuming that programming begins by applying 16V as a program start voltage and is finished at 19V, a first program speed is stored as 19V.

When the number of program pulses applied at this time is 5, the first program speed is stored as 5.

It is then determined whether the number of the program/erase operations corresponds to a reference value N(i) at step 540.

In the present invention, a program speed is measured only when the program/erase operation reaches a specific number and a program start voltage is changed according to the measurement result.

Here, the reference value is decided according to the characteristic graph of FIG. 3.

As mentioned earlier, the program speed can be measured every log(M) times or when it corresponds to 10 times, 100 times, 1000 times, 10000 times and the like.

If, as a result of the determination, the number of the program/erase operations does not correspond to the reference value N(i), the program/erase operation is performed repeatedly at step 560.

When a target number of the program/erase operations is reached, the operation is stopped at step 570. However, it is not meant that the embodiment itself of FIG. 5 is stopped. That is, the operation may be temporarily stopped according to an application. However, if the non-volatile memory device operates again, the algorithm is executed again.

If, as a result of the determination, the number of the program/erase operations corresponds to the reference value N(i), a second program speed of the reference memory cell is measured at step 544.

Here, the program speed may have been changed in a state where the program/erase operations have been performed as many as the reference value. Thus, the program speed is measured again. This measured value is compared with the first program speed.

It is then determined whether a difference between the measured second program speed and the stored first program speed is greater than a step voltage Vstep at step 550. Since the program speed becomes fast on the whole, the program voltage or the number of program pulses, stored as the second program speed, will be reduced when compared with the first program speed.

Accordingly, it is determined whether the first program speed is greater than the second program speed by the step voltage.

Here, it is assumed that the first program speed is 19V and the step voltage applied according to the ISPP programming method is 0.3V.

When a second program speed measured after the program/erase operation is performed by a reference value is 18.6V, it is considered that a difference between the first program speed and the second program speed is greater than the step voltage.

However, when the second program speed is 18.8V, it is considered that a difference between the first program speed and the second program speed is smaller than the step voltage.

Further, it is assumed that the first program speed is 5 in number. That is, it is meant that programming is completed by applying five step voltages.

When a second program speed measured after the program/erase operation is performed by a reference value is four in number, it is considered that a difference between the first program speed and the second program speed is greater than the step voltage.

However, when the second program speed is 5 in number, it is meant that a difference between the first program speed and the second program speed is smaller than the step voltage.

If, as a result of the comparison at step 550, a difference between the first program speed and the second program speed is smaller than the step voltage Vstep, the program/erase operation is repeatedly executed without changing the program start voltage at step 560.

However, if, as a result of the comparison at step 550, a difference between the first program speed and the second program speed is greater than the step voltage, the program start voltage is changed at step 552.

In other words, assuming that programming was started by applying 16V as the program start voltage, the first program speed is 19V, and the second program speed is 18.6V, the program start voltage is lowered by the step voltage.

Here, if, as a result of the comparison, a difference between the program speeds is n times the step voltage, the program start voltage is lowered as much as n times.

For instance, when the first program speed is 19V and the second program speed is 18V, a difference between the program speeds is three times greater than the step voltage although it is not four times greater than the step voltage. Accordingly, the program start voltage is reduced three times.

If the start voltage is changed as described above, programming begins at low voltage. Thus, there is an advantage in that the program speed can be lowered with respect to cells whose program speed has risen.

Meanwhile, if the number of program pulses as a program speed according to an embodiment, voltage corresponding to a step voltage corresponding to the difference can be reduced.

In other words, when a first program speed is 5 in number and a second program speed is 4 in number, voltage is reduced as much as one step voltage.

When a difference between the first program speed and the second program speed is 1 or more, voltage is reduced that much or more.

For instance, when the first program speed is 5 in number and the second program speed is 2 in number, 0.9V corresponding to three step voltages is reduced.

Thereafter, the second program speed is stored in the program speed storage unit as the first program speed at step 554.

If the program speed is changed subsequently, determination thereof has to be performed based on a newly measured program speed, so this step is performed.

The reference value is then reset at step 542.

As the number of the program/erase cycles will reach a next reference value N(i)+1, the reference value is reset in preparation for that.

For instance, assuming that a Log(M) value is used as the N(i), a case where M=1 is measured and stored as a first program speed.

When M=10, i=1, when M=100, i=2, and when M=1000, i=3.

Thus, when the number of the program/erase cycles is 10, a second program speed is measured. Thereafter, when the number of the program/erase cycles is 100, 1000, and so on, the second program speed is measured.

This reference value can be varied by a user so that it approaches the graph of FIG. 3.

If this operation is repeatedly performed, the program start voltage is changed by comparing the first program speed and the second program speed every reference value of the program/erase cycle that was previously set by a designer.

Figure 6:
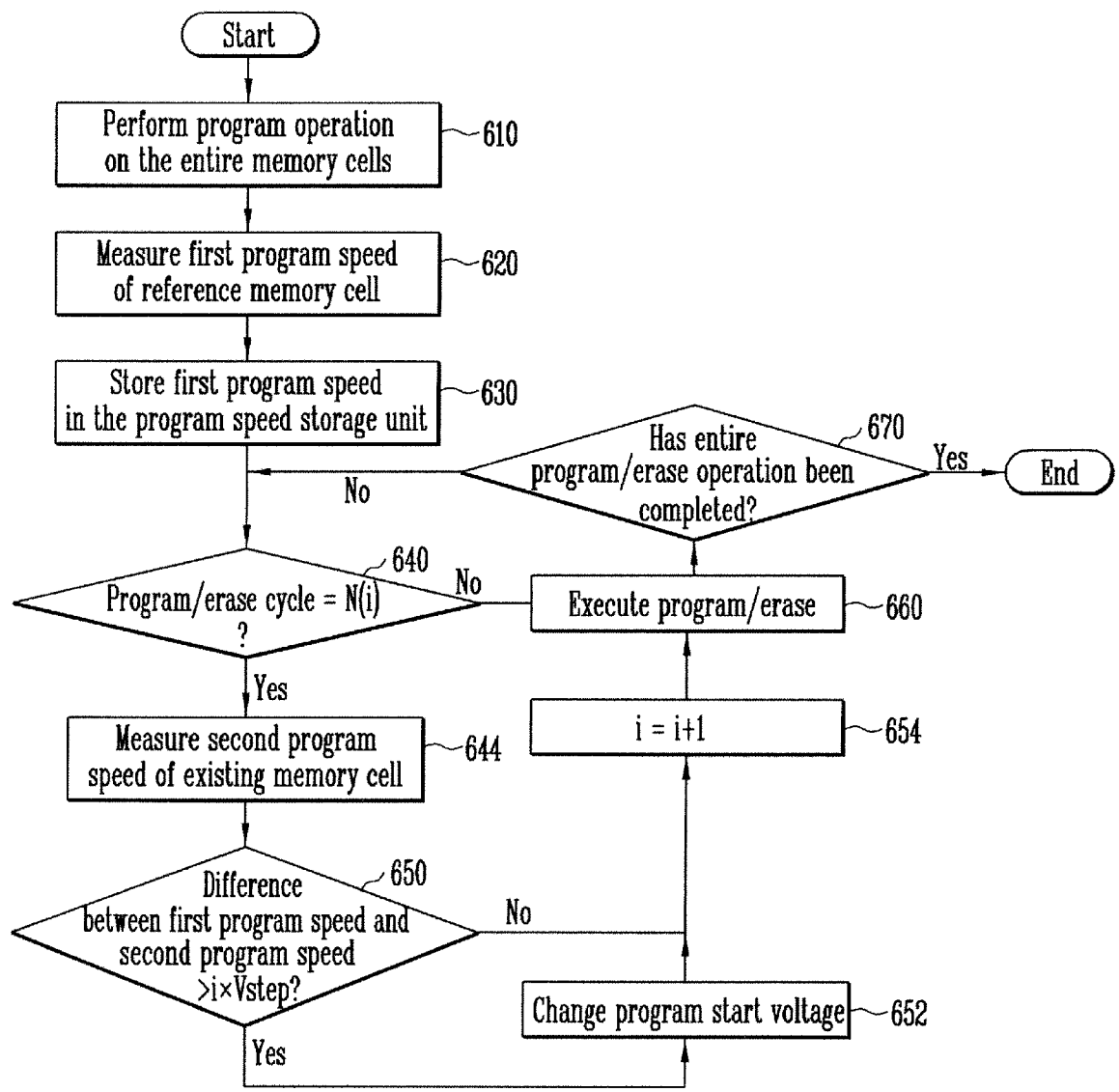
FIG. 6 is a flowchart illustrating an operation of the non-volatile memory device according to another embodiment of the present invention.

FIG. 6 is a flowchart illustrating an operation of the non-volatile memory device according to another embodiment of the present invention.

An overall sequence of the flowchart of FIG. 6 is similar to that of FIG. 5 except for the step of comparing the first program speed and the second program speed and whether to reset the first program speed.

That is, in the present embodiment, a first program speed that is first stored is not changed. A first program speed is permanently stored in the program speed storage unit. Thus, the program speed resetting step (554) of FIG. 5 is not carried out.

Further, in the step of comparing a difference between the second program speed and the first program speed, a step voltage to be compared is changed according to the reference value of program/erase cycles.

In other words, when a difference between the second program speed and the first program speed is determined based on a first reference value N(1), whether a difference between the first program speed and the second program speed is greater than a unit step voltage is determined.

If, as a result of the determination, the difference between the first program speed and the second program speed is smaller than the unit step voltage, a program start voltage is not changed. However, if the difference between the first program speed and the second program speed is greater than the unit step voltage, the program start voltage is reduced as much as the unit step voltage.

Thereafter, when a difference between the second program speed and the first program speed is compared based on a second reference value N(2) as the number of program/erase cycles is increased, the second program speed is measured again based on a corresponding reference value and a difference between the first program speed and the measured second program speed is determined. Here, it is determined whether a difference between the first program speed and the second program speed is greater than twice step voltage.

If, as a result of the determination, the difference between the first program speed and the measured second program speed is greater than the twice step voltage, the program start voltage is reduced as much as twice unit step voltage.

Further, if the difference between the first program speed and the measured second program speed is smaller than the twice step voltage, but greater than the unit step voltage, the start voltage is reduced as much as the unit step voltage.

Further, if the difference between the first program speed and the measured second program speed is smaller than the step voltage, the program start voltage is not changed.

This can be generalized as follows. In the case where the number of program/erase cycles is increased and therefore the first program speed and the second program speed are compared based on an $i^{th}$ reference value N(i), the second program speed is measured again based on a corresponding reference value and is then compared with the first program speed. Here, it is determined whether the difference between the first program speed and the measured second program speed is greater than an i-times step voltage.

If, as a result of the determination, the difference between the first program speed and the measured second program speed is greater than an i-times step voltage, a program start voltage is reduced as much as an i-times unit step voltage.

If, as a result of the determination, the difference between the first program speed and the measured second program speed is smaller than the i-times step voltage, but greater than a (i−1)-times step voltage, the program start voltage is reduced as much as the unit step voltage.

If, as a result of the determination, the difference between the first program speed and the measured second program speed is smaller than the (i−1)-times step voltage, but greater than a (i−2)-times step voltage, the program start voltage is reduced as much as the unit step voltage.

The above process is repeatedly preformed. If the program start voltage is smaller than the unit step voltage, the program start voltage is not changed.

Figure 7:
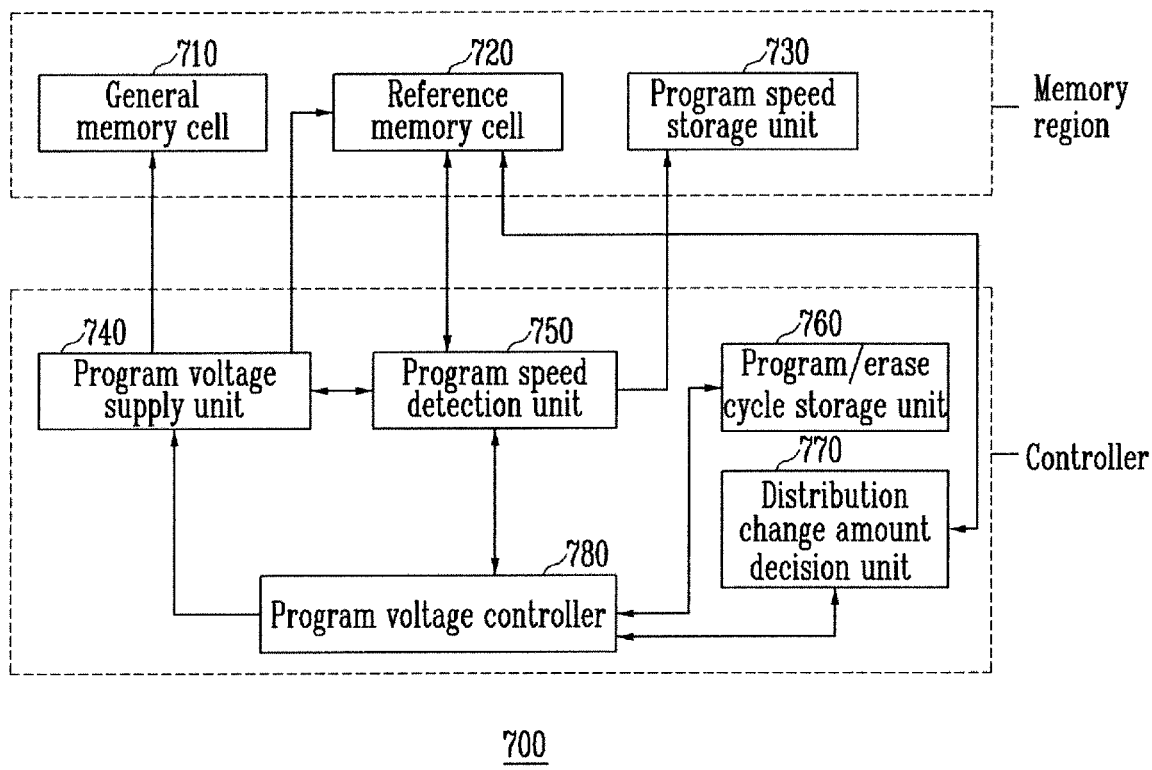
FIG. 7 is a block diagram showing a non-volatile memory device according to another embodiment of the present invention.

FIG. 7 is a block diagram showing a non-volatile memory device according to another embodiment of the present invention.

A non-volatile memory device 700 includes, similar to that of FIG. 4, a general memory cell 710 in which data is stored, a reference memory cell 720, which performs the same function as that of the general memory cell 710, but becomes a sample for measuring the program speed of a cell, a program speed storage unit 730 for storing the program speeds of the reference memory cells 720, a program voltage supply unit 740 for applying a program voltage to the general memory cell 710 and the reference memory cell 720, a program speed detection unit 750 for determining whether the reference memory cells 720 have all been programmed at a specific verify voltage or higher and detecting voltage applied to a corresponding word line at a corresponding point of time, a program/erase cycle storage unit 760 for storing a total number of program/erase operations of a non-volatile memory device, and a program voltage controller 770 for determining to lower a program voltage by comparing a first program speed stored in the program speed storage unit 730 and a second program speed detected by the program speed detection unit 750 depending on the number of a program/erase operation.

The non-volatile memory device 700 further includes a distribution change amount decision unit 770 that reflects a change of threshold voltage distributions depending on the number of program/erase cycles to control a program voltage.

The non-volatile memory device has a tendency that the program speed is increased as the number of program/erase cycles increases and, therefore, overall distributions become wide. For instance, assuming that a difference between the highest threshold voltage and the lowest threshold voltage of an off cell when the cycle of program/erase operations is 1 is 1V, there is a tendency that a difference between the highest threshold voltage and the lowest threshold voltage of an off cell when the cycle of program/erase operations is 1000 increases to 1.1V.

When there is a change of distributions as described above, a program voltage has to be set considering the change. That is, if distributions of the threshold voltage are changed as the program speed increases, a program voltage must be reset by determining whether a value in which the change amount of the distributions is subtracted from a difference between a reference program speed and a changed program speeds is identical to a step voltage.

The distribution change amount decision unit 770 can determine the change amount of distributions using, largely, two methods.

In the first method, a change degree of distributions, appearing every program/erase-cycle basis, is measured statistically and reflected. That is, a change degree of distributions, corresponding to the reference value N(i), is previously measured and stored. When corresponding times are reached, the change amount of distributions is read and used to control a program voltage.

Meanwhile, the distribution change amount decision unit 770 includes a plurality of registers for storing the change amount of distributions according to a reference value.

In the second method, a change degree of distributions, appearing per on program/erase-cycle basis, is directly measured and reflected. That is, the highest threshold voltage value, corresponding to a first reference value, is previously measured and stored. The highest threshold voltage value corresponding to a next reference value N(i) is measured and compared with the stored value. In principle, a difference between the lowest threshold voltage value and the highest threshold voltage value is found and reference values are compared based on the difference. However, the lowest threshold voltage value has the same value as a verify reference voltage. Thus, a change degree of distributions can be measured by comparing only the highest threshold voltage values.

Here, the highest threshold voltage value can be measured according to two kinds of principles.

In the first principle, when a corresponding voltage is constantly lowered in a state where voltage to pass the entire cells is applied to a word line in a verify step, voltage applied when a first fail cell is generated can be used as the highest threshold voltage.

Preferably, in a state where the entire cells are read to be programmed (the entire cell pass state) when a reference memory cell that has been fully programmed is read, a read voltage is measured by decreasing it by 0.1V, and a read voltage applied when a cell that has not been programmed is first read is used as the highest threshold voltage.

In the second principle, when a corresponding voltage is constantly raised in a state where voltage through which some fail cells are generated is applied to a word line in a verify step, voltage applied when the entire cells are failed can be used as the highest threshold voltage.

Preferably, in a state where only some cells are read to be programmed (some cell fail state) when a reference memory cell that has been fully programmed is read, a read voltage is measured by increasing it by 0.1V, and a read voltage applied when the entire cells are read to be programmed (the entire cell pass state) is used as the highest threshold voltage.

The highest threshold voltage values measured as described above are compared and a difference thereof is decided as the change amount of distributions.

Meanwhile, the distribution change amount decision unit 770 includes one or more registers for storing the highest threshold voltage value at a just-before reference value.

The distribution change amount decision unit 770 compares the highest threshold voltage value at a current reference value with a threshold voltage value stored in the register.

The change amount of distributions decided as described above is used as follows.

In comparing a difference between the first program speed and the second program speed, it is determined whether the difference is greater than the sum of the step voltage and the change amount of distributions. If the difference is greater than the sum of the step voltage and the change amount of distributions, a program voltage is reset by reflecting the change amount of distributions also.

A detailed operation of the non-volatile memory device is described below.

Figure 8:
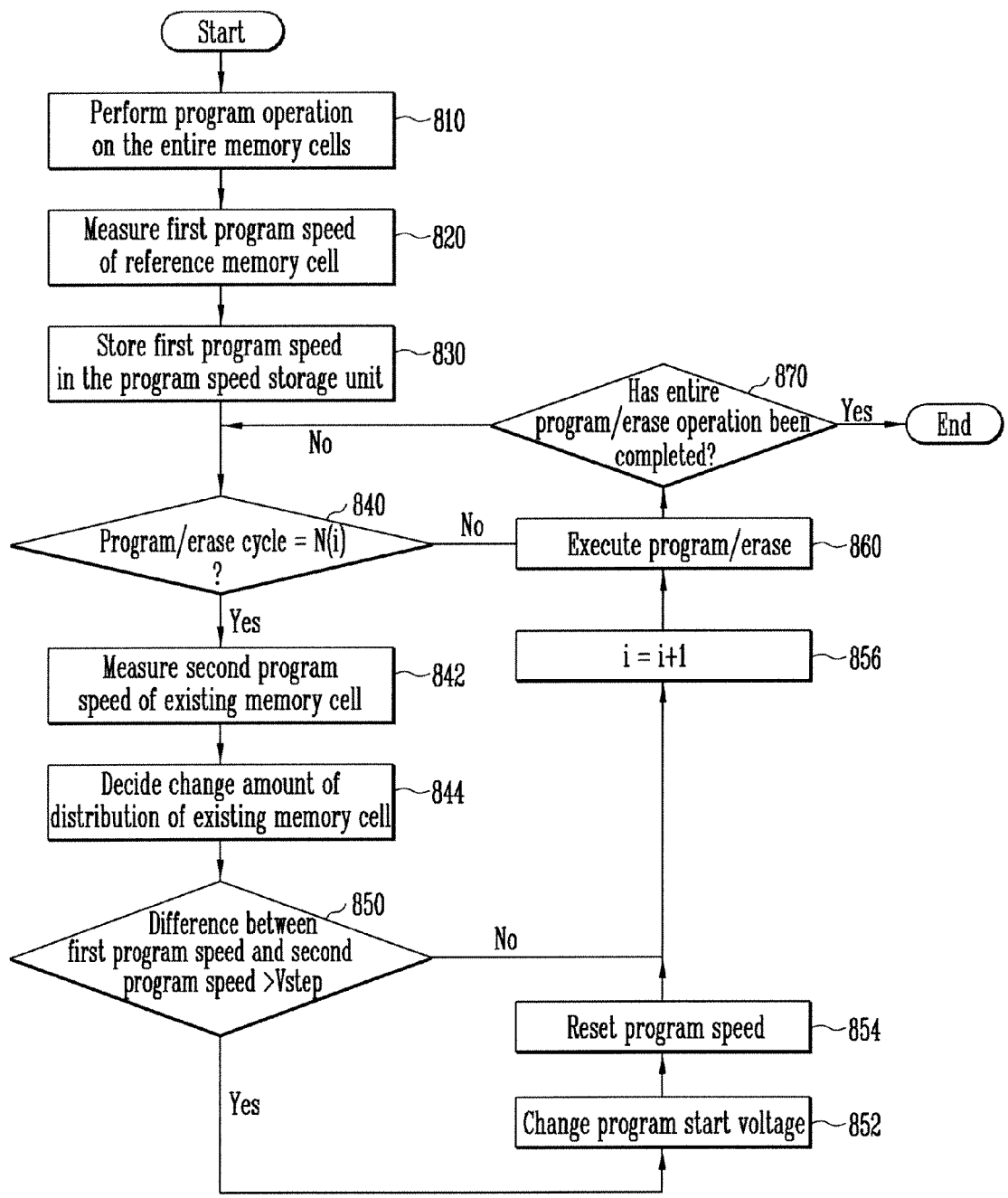
FIG. 8 is a flowchart illustrating an operation of the non-volatile memory device according to still another embodiment of the present invention.

FIG. 8 is a flowchart illustrating an operation of the non-volatile memory device according to still another embodiment of the present invention.

The steps of FIG. 8 are almost similar to those of FIG. 5.

A program operation is first performed on the entire memory cells at step 810.

A first program speed of the reference memory cell 420 is then measured at step 820.

The first program speed is stored in the program speed storage unit 430 at step 830.

It is determined whether the number of a program/erase operation corresponds to a reference value N(i) at step 840.

If, as a result of the determination, the number of the program/erase operation does not correspond to the reference value N(i), the program/erase operation are repeatedly executed at step 860.

If a total number of the program/erase operations are completed, the operation is stopped at step 870.

If, as a result of the determination, the number of the program/erase operation corresponds to the reference value N(i), a second program speed of the reference memory cell is measured at step 842.

The change amount of distributions of the reference memory cell is decided at step 844.

The decision methods can be performed using the following two kinds of methods.

As the first method, a change amount of distributions stored in the distribution change amount decision unit 770 is read and used.

A change amount of distributions appearing every program/erase cycle is previously stored in the distribution change amount decision unit. Thus, a change amount of distributions corresponding to the reference value N(i) is sent to the program voltage controller.

As the second method, a change amount of distributions of the reference memory cell 720 is directly measured and decided.

That is, the distribution change amount decision unit 770 compares a difference between the highest threshold voltage value at a first reference value N(i−1) and the highest threshold voltage value at a second reference value N(i).

To this end, the highest threshold voltage value at the first reference value N(i−1) stored in the distribution change amount decision unit is read, and a difference between the read highest threshold voltage value at the first reference value N(i−1) and the highest threshold voltage value at the measured second reference value N(i) is decided as the change amount of distributions.

It is then determined whether a difference between the measured second program speed and the stored first program speed is greater than the sum of the step voltage and the change amount of distributions at step 850.

It is assumed that the first program speed is 19V and the step voltage applied according to the ISPP programming method is 0.3V.

It is also assumed that the change amount of distributions after the program/erase cycle is performed as much as the reference value is 0.1V.

When the second program speed measured after the program/erase cycle is performed as much as the reference value is 18.5V, it is considered that a difference between the first program speed and the second program speed is greater than the sum of the step voltage and the change amount of distributions.

However, when the measured second program speed is 18.8V, it is considered that the difference between the first program speed and the second program speed is smaller than the sum of the step voltage and the change amount of distributions.

If, as a result of the comparison at step 850, the difference between the first program speed and the second program speed is smaller than the sum of the step voltage and the change amount of distributions, the program/erase operation is repeatedly executed without changing the program start voltage at step 860.

However, if, as a result of the comparison at step 850, the difference between the first program speed and the second program speed is greater than the sum of the step voltage and the change amount of distributions, the program start voltage is changed at step 852.

That is, as described above, programming was started by applying 16V as the program start voltage. When the first program speed is 19V and the second program speed is 18.5V, the program start voltage is reduced as much as the step voltage.

If the start voltage is changed as described above, programming begins at low voltage. Thus, there is an advantage in that a program speed of cells whose program speed has risen can be lowered.

The second program speed is then stored in the program speed storage unit as the first program speed at step 854.

This step is performed because when the program speed is changed subsequently, a determination thereof must be made based on the newly measured program speed.

However, it is to be noted that the step of resetting the second program speed as the first program speed is not temporally in the front and rear relation with respect to the step of changing the program start voltage. That is, after the step 550 is performed, the step of resetting the second program speed as the first program speed can be performed before the step of changing the program start voltage, or the step of resetting the second program speed as the first program speed can be performed simultaneously with the step of changing the program start voltage.

The reference value is then reset at step 856.

If this operation is repeatedly performed, the program start voltage can be changed by comparing the first program speed and the second program speed every reference value of a program/erase cycle, which is previously set by a designed.

As described above, according to the present invention, a program start voltage can be reset according to a predetermined number of program/erase operations. That is, when a specific number of program/erase operations are reached while a non-volatile memory device operates, it is determined whether to reduce or maintain the program start voltage of ISPP based on a program speed at that time.

Consequently, a phenomenon in which cells having a relatively fast program speed deviate from normal distributions of the threshold voltage can be prevented.

Further, the number of program pulses applied can be maintained constantly irrespective of a change of the number of the program/erase operation.

Meanwhile, a program start voltage can be reset by considering not only a difference between program speeds depending on the number of a program/erase operation, but also a change amount of distributions of the threshold voltage.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A non-volatile memory device, comprising:
a program speed detection unit for measuring a program speed of reference memory cells of the entire memory cells;
a program speed storage unit for storing the program speed; and
a program voltage controller for determining whether to change a program voltage by comparing a first program speed stored in the program speed storage unit and a second program speed detected through the program speed detection unit according to a number of a program/erase operation.

2. The non-volatile memory device of claim 1, wherein the program speed detection unit determines whether the reference memory cells have all been programmed over a specific verify voltage and detects a program voltage applied to a word line of corresponding cells at a corresponding point of time.

3. The non-volatile memory device of claim 1, wherein the program speed detection unit determines whether the reference memory cells have all been programmed over a specific verify voltage and detects a number of program pulses, which are applied until a program voltage applied to a word line of corresponding cells is reached at a corresponding point of time.

4. The non-volatile memory device of claim 1, further comprising a program/erase cycle storage unit for storing a total number of program/erase operations performed while the non-volatile memory device operates.

5. The non-volatile memory device of claim 1, further comprising a distribution change amount decision unit for storing a change amount of distributions of a threshold voltage according to the number of the program/erase operations.

6. The non-volatile memory device of claim 1, further comprising a distribution change amount decision unit for comparing a highest threshold voltage value at a first program/erase cycle and a highest threshold voltage value at a second program/erase cycle greater than the second program/erase cycle and outputting a change amount of distributions.

7. The non-volatile memory device of claim 1, wherein the program speed storage unit permanently stores a program speed after a first program.

* * * * *